(12) United States Patent (10) Patent No.: US 11,754,631 B2
Matsushita et al. (45) Date of Patent: Sep. 12, 2023

(54) CHARGEABLE BATTERY TEMPERATURE ESTIMATION APPARATUS AND CHARGEABLE BATTERY TEMPERATURE ESTIMATION METHOD

(71) Applicants: FURUKAWA ELECTRIC CO., LTD., Tokyo (JP); FURUKAWA AUTOMOTIVE SYSTEMS INC., Shiga (JP)

(72) Inventors: Masashi Matsushita, Tokyo (JP); Katsuhide Hamada, Tokyo (JP)

(73) Assignees: FURUKAWA ELECTRIC CO., LTD., Tokyo (JP); FURUKAWA AUTOMOTIVE SYSTEMS INC., Shiga (JP)

( * ) Notice: Subject to any disclaimer, the term of this patent is extended or adjusted under 35 U.S.C. 154(b) by 0 days.

(21) Appl. No.: 18/087,740

(22) Filed: Dec. 22, 2022

(65) Prior Publication Data

US 2023/0139549 A1 May 4, 2023

Related U.S. Application Data

(63) Continuation of application No. 16/914,118, filed on Jun. 26, 2020, now Pat. No. 11,575,162, which is a
(Continued)

(30) Foreign Application Priority Data

Dec. 27, 2017 (JP) .................................. 2017-251373

(51) Int. Cl.
*G01R 31/374* (2019.01)
*B60R 16/04* (2006.01)
(Continued)

(52) U.S. Cl.
CPC ............ *G01R 31/374* (2019.01); *B60R 16/04* (2013.01); *G01K 3/02* (2013.01); *G01K 7/00* (2013.01);
(Continued)

(58) Field of Classification Search
CPC .. G01R 31/374; H01M 10/48; H01M 10/486; H02J 7/007
(Continued)

(56) References Cited

U.S. PATENT DOCUMENTS

2007/0298316 A1* 12/2007 Yamamoto .......... H01M 10/486
429/62
2015/0331059 A1* 11/2015 Okada ................... H01M 10/48
320/134
(Continued)

FOREIGN PATENT DOCUMENTS

EP 2 952 920 A1 12/2015
JP 9-92347 A 4/1997
(Continued)

OTHER PUBLICATIONS

International Search Report (ISR) issued in PCT/JP2018/047799 dated Mar. 2019. (Cited in the parent U.S. Appl. No. 16/914,118.).
(Continued)

*Primary Examiner* — Nathaniel R Pelton
(74) *Attorney, Agent, or Firm* — CHEN YOSHIMURA LLP

(57) ABSTRACT

A chargeable battery temperature estimation apparatus estimating an internal temperature of a chargeable battery includes a processor performing when executing the instructions stored in a memory: acquiring a detected current value output from a current sensor configured to detect a current flowing in the chargeable battery; calculating a heating value on the basis of the detected current value, the heating value
(Continued)

estimating heat generated inside the chargeable battery; acquiring a detected external temperature value output from a temperature sensor configured to detect an external temperature of the chargeable battery; estimating the internal temperature of the chargeable battery based on the calculated heating value and the detected temperature value; and outputting the estimated internal temperature.

9 Claims, 12 Drawing Sheets

Related U.S. Application Data continuation of application No. PCT/JP2018/047799, filed on Dec. 26, 2018.

(51) Int. Cl.
*G01K 3/02* (2006.01)
*G01K 7/00* (2006.01)
*H01M 10/48* (2006.01)
*H02J 7/00* (2006.01)

(52) U.S. Cl.
CPC ......... *H01M 10/48* (2013.01); *H01M 10/486* (2013.01); *H02J 7/007* (2013.01)

(58) Field of Classification Search
USPC ......................................................... 429/62
See application file for complete search history.

(56) References Cited

U.S. PATENT DOCUMENTS

| 2016/0146896 | A2 | 5/2016 | Okada et al. |
| 2019/0074499 | A1 | 3/2019 | Ogawa et al. |

FOREIGN PATENT DOCUMENTS

| JP | 2001-76769 A | 3/2001 |
| JP | 2012-192811 A | 10/2012 |
| JP | 2014-232649 A | 12/2014 |
| JP | 5829767 A | 12/2015 |
| JP | 2017-157348 A | 9/2017 |

OTHER PUBLICATIONS

Written Opinion (PCT/ISA/237) issued in PCT/JP2018/047799 dated Mar. 2019. (Cited in the parent U.S. Appl. No. 16/914,118.).

Pilatowicz et al., "Simulation of SLI Lead-Acid Batteries for SoC, Aging and Cranking Capability Prediction in Automotive Applications", A1410 Journal of The Electrochemical Society, Aug. 14, 2012 (Aug. 14, 2012), pp. 1410-1419, XP055225159 (Cited in the parent U.S. Appl. No. 16/914,118.).

Extended European Search Report dated Jan. 14, 2021, in a counterpart European patent application No. 18896141.1. (Cited in the parent U.S. Appl. No. 16/914,118.).

European Office Action dated Oct. 12, 2021, in a counterpart European patent application No. 18896141.1. (Cited in the parent U.S. Appl. No. 16/914,118.).

Japanese Office Action dated Apr. 19, 2022, in a counterpart Japanese patent application No. 2019-562090. (Cited in the parent U.S. Appl. No. 16/914, 118 and a machine translation (not reviewed for accuracy) attached.).

European Office Action dated May 17, 2022, in a counterpart European patent application No. 18896141.1. (Cited in the parent U.S. Appl. No. 16/914,118.).

Chinese Office Action dated Feb. 18, 2023 in a counterpart Chinese patent application No. 201880079171.4. (A machine translation (not reviewed for accuracy) attached.).

Communication from EPO dated Mar. 30, 2023, in a counterpart European patent application No. 18896141.1.

\* cited by examiner

|  | FIRST | SECOND |
|---|---|---|
| PROPORTIONAL GAIN G_prop | 0.1 | 0.07 |
| INTEGRAL GAIN G_integ | 0.015 | 0.0005 |

FIG. 6

CHARGEABLE BATTERY TEMPERATURE ESTIMATION APPARATUS AND CHARGEABLE BATTERY TEMPERATURE ESTIMATION METHOD

TECHNICAL FIELD

This disclosure relates to a chargeable battery temperature estimation apparatus and a chargeable battery temperature estimation method.

BACKGROUND ART

In recent years, in automobiles or the like, the number of electric devices operated using electric power stored in chargeable batteries has increased. In addition, for example, more and more devices relating to safe traveling, such as an electric power steering and an electric brake, are operated with chargeable batteries. It is known that characteristics of such chargeable batteries vary depending on a temperature. For example, a capacity of a chargeable battery may drop further as the temperature lowers. Thus, when the temperature is low, startability of an engine may drop. For this reason, in consideration of safety etc., the temperature of a chargeable battery needs to be ascertained. However, the chargeable battery includes a strong acid or strong alkaline electrolytic solution having high corrosiveness, and this makes it difficult to set a temperature sensor inside the chargeable battery to detect internal temperature thereof.

Patent Document 1 discloses a method of estimating a chargeable battery temperature by estimating a chargeable battery temperature through performing an proportional operation and an integral operation on a difference value between a detected temperature value, which is detected using a temperature sensor that detects external temperature of a chargeable battery, and a previous estimated temperature value.

Further, Patent Document 2 discloses a method of estimating a battery temperature by calculating each of chemical reaction heat and Joule heat generated due to charging and discharging currents, and calculating a sum of the chemical reaction heat and the Joule heat, then estimating a battery temperature based on the sum.

CITATION LIST

Patent Documents

Patent Document 1: JP 2012-192811 A
Patent Document 2: JP 2017-157348 A

SUMMARY

Technical Problem

Incidentally, according to technology disclosed in Patent Document 1, an internal temperature of a chargeable battery is estimated based on an amount of variation of the internal temperature due to flow of heat into or out of the chargeable battery. This means that Joule heat generation and chemical reaction heat due to charging and discharging currents, i.e., heat generation, inside the chargeable battery are not taken into consideration, and the amount of internal heat generation due to charge and discharge may be erroneous. This causes a problem whereby the internal temperature cannot be correctly estimated.

Further, technology disclosed in Patent Document 2 takes into account internal heat generation due to charging and discharging currents, however, in the technology, because chemical reaction heat and Joule heat generation due to charging and discharging currents are calculated separately before results of each calculation are added up, there may be a problem whereby a calculation load increases.

The present disclosure is made under such circumstances as described above, and has an object to provide a chargeable battery temperature estimation apparatus and a chargeable battery temperature estimation method capable of accurately estimating an internal temperature of a chargeable battery through simple calculation.

Solution to Problem

To solve the problems described above, in one aspect, the present disclosure provides a chargeable battery temperature estimation apparatus estimating an internal temperature of a chargeable battery, the chargeable battery temperature estimation apparatus including: a processor; and a memory storing instructions executable by the processor, wherein the processor performs the following when executing the instructions stored in the memory; acquiring a detected current value output from a current sensor configured to detect a current flowing in the chargeable battery; calculating a heating value on the basis of the detected current value, the heating value estimating heat generated inside the chargeable battery; acquiring a detected external temperature value output from a temperature sensor configured to detect an external temperature of the chargeable battery; estimating the internal temperature of the chargeable battery based on the calculated heating value and the detected temperature value; and outputting the estimated internal temperature wherein in calculating the heating value, the processor estimates, as the heating value, a sum of heat amounts of Joule heat and chemical reaction heat generated inside the chargeable battery by multiplying the detected current value by a coefficient $\alpha$, and wherein in estimating the internal temperature, the processor performs the following: calculating a difference value between the detected temperature value and a previously estimated value of the internal temperature that has been previously estimated, and performs a proportional operation on the difference value, performing an integral operation on an added value of the heating value and the difference value, and adding together values obtained through the proportional operation and the integral operation.

According to such a configuration, the internal temperature of the chargeable battery can be accurately estimated by simple calculation.

According to such a configuration, the heat generated inside the chargeable battery can be accurately detected, and the internal temperature can be accurately estimated.

According to such a configuration, the internal temperature can be accurately estimated by simple calculation.

According to such a configuration, the heating value can be easily calculated.

In the above-described chargeable battery temperature estimation apparatus, the coefficient $\alpha$ may be a function of the detected current value, and a value of the coefficient $\alpha$ may vary in accordance with the detected current value detected by the current sensor.

According to such a configuration, a heating value can be accurately estimated by simple calculation.

In the above-described chargeable battery temperature estimation apparatus, the coefficient $\alpha$ may be a function of the detected current value, and a value of the coefficient α may vary depending on whether the chargeable battery is being charged or being discharged.

According to such a configuration, occurrence of errors can be reduced.

In the above-described chargeable battery temperature estimation apparatus, the processor may acquire a detected voltage value output from a voltage sensor configured to detect a voltage of the chargeable battery, and said function for the coefficient α may be also a function of the detected voltage value of the chargeable battery when the chargeable battery is being charged.

According to such a configuration, occurrence of errors can be further reduced.

In the above-described chargeable battery temperature estimation apparatus, the processor may acquire a detected voltage value output from a voltage sensor configured to detect a voltage of the chargeable battery, and said function for the coefficient α may be also a function of the detected voltage value of the chargeable battery when the chargeable battery is being discharged, According to such a configuration, occurrence of errors can be further reduced.

In the above-described chargeable battery temperature estimation apparatus, the processor may set a value of the coefficient α according to a state of deterioration of the chargeable battery.

According to such a configuration, the internal temperature of the chargeable battery can be accurately estimated regardless of a state of deterioration of the chargeable battery.

In the above-described chargeable battery temperature estimation apparatus, in estimating the internal temperature, the processor may calculate an estimated value of the internal temperature, based on expressions below:

$$Tb(n) = VT\_prop(n) + VT\_integ(n),$$

$$VT\_prop(n) = dT(n) \times G\_prop, \text{ and}$$

$$VT\_integ(n) = dT(n) \times G\_integ + VT\_integ(n-1) + I(n) \times \alpha,$$

where Tb(n) represents the estimated value of the internal temperature of the chargeable battery, dT(n) represents the difference value between the detected temperature value detected by the temperature sensor and the estimated value of the internal temperature previously estimated, G_prop represents a proportional gain of the proportional operation, G_integ represents an integral gain of the integral operation, I(n) represents the detected current value detected by the current sensor, and α represents a coefficient used for calculating the heating value.

According to such a configuration, the internal temperature of the chargeable battery can be accurately estimated through an operation in the discrete time domain.

Further, in the above-described chargeable battery temperature estimation apparatus, the processor calculates the heating value only when an absolute value of the detected current value detected by the current sensor is greater than or equal to a predetermined threshold value.

According to such a configuration, the internal temperature of the chargeable battery can be accurately estimated with an amount of calculation being reduced.

Further, in the above-described chargeable battery temperature estimation apparatus, the chargeable battery may be configured to be mounted in a vehicle and the processor may output the estimated internal temperature to the controller in the vehicle such that the controller in the vehicle changes an operation state of the vehicle based on the outputted estimated internal temperature.

According to such a configuration, the state of the vehicle can be appropriately controlled according to the estimated internal temperature of the chargeable battery.

In another aspect, the present disclosure provides a chargeable battery temperature estimation method for estimating an internal temperature of a chargeable battery, the chargeable battery temperature estimation method including: acquiring a detected current value output from a current sensor configured to detect a current flowing in the chargeable battery; calculating a heating value on the basis of the detected current value, the heating value estimating heat generated inside the chargeable battery; acquiring a detected temperature value output from a temperature sensor configured to detect an external temperature of the chargeable battery; estimating the internal temperature of the chargeable battery based on the heating value and the detected temperature value; and outputting the estimated internal temperature, wherein the calculating the heating value includes estimating, as the heating value, a sum of heat amounts of Joule heat and chemical reaction heat generated inside the chargeable battery by multiplying the detected current value by a coefficient α, and wherein the estimating the internal temperature includes: calculating a difference value between the detected temperature value and a previously estimated value of the internal temperature that has been previously estimated, and performs a proportional operation on the difference value, performing an integral operation on an added value of the heating value and the difference value, and adding together values obtained through the proportional operation and the integral operation.

According to such a method, the internal temperature of the chargeable battery can be accurately estimated by simple calculation.

In the above-described chargeable battery temperature estimation method, the estimating the internal temperature may include calculating an estimated value of the internal temperature, based on expressions below:

$$Tb(n) = VT\_prop(n) + VT\_integ(n),$$

$$VT\_prop(n) = dT(n) \times G\_prop, \text{ and}$$

$$VT\_integ(n) = dT(n) \times G\_integ + VT\_integ(n-1) + I(n) \times \alpha,$$

where Tb(n) represents the estimated value of the internal temperature of the chargeable battery, dT(n) represents the difference value between the detected temperature value detected by the temperature sensor and the estimated value of the internal temperature previously estimated, G_prop represents a proportional gain of the proportional operation, G_integ represents an integral gain of the integral operation, I(n) represents the detected current value detected by the current sensor, and α represents a coefficient used for calculating the heating value, thereby I(n)×α representing the calculated heating value.

Advantageous Effects of Invention

According to the present disclosure, a chargeable battery temperature estimation apparatus and a chargeable battery temperature estimation method capable of accurately estimating an internal temperature of a chargeable battery by simple calculation can be provided.

BRIEF DESCRIPTION OF DRAWINGS

FIG. 6 is a table for describing a modified embodiment of the disclosure.

DESCRIPTION OF EMBODIMENTS

Next, embodiments of the present invention will be described.

(A) Description of Configuration According to Embodiments of Disclosure

Figure 1:
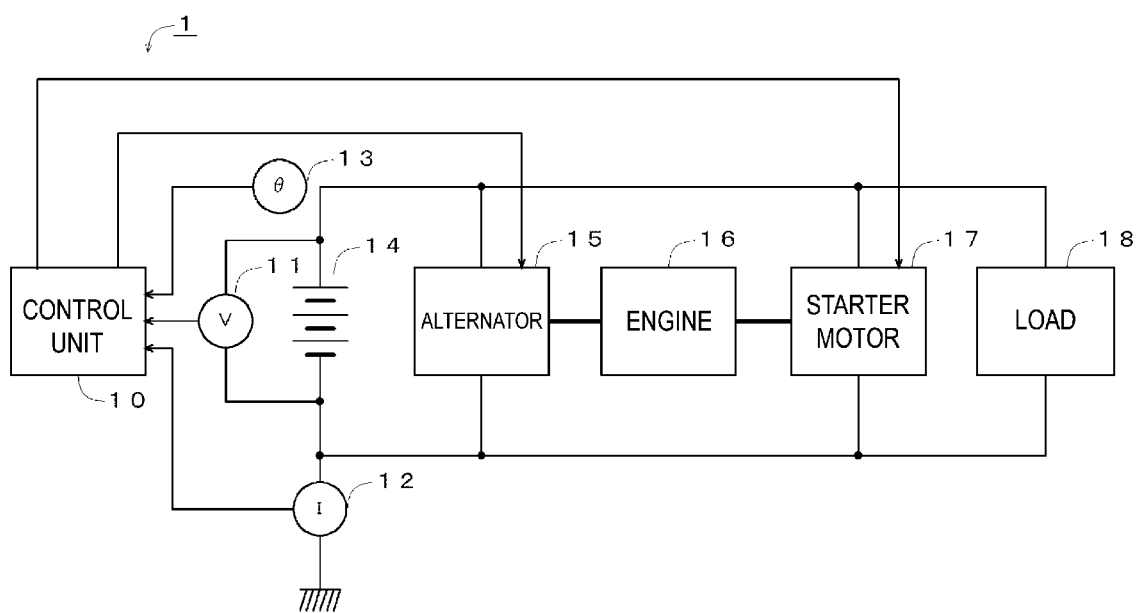
FIG. 1 is a diagram illustrating a configuration example of a chargeable battery temperature estimation apparatus according to an embodiment of the present invention.

FIG. 1 is a diagram illustrating a power supply system of a vehicle having a chargeable battery temperature estimation apparatus according to an embodiment of the disclosure. In FIG. 1, a chargeable battery temperature estimation apparatus 1 includes main components, which are a control unit 10, a voltage sensor 11, a current sensor 12, and a temperature sensor 13, and estimates an internal temperature of a chargeable battery 14 and reports the same to a higher-level device (for example, an electric control unit (ECU)) (not illustrated).

Here, the control unit 10 estimates an internal temperature of the chargeable battery 14 by referring to outputs from the voltage sensor 11, the current sensor 12, and the temperature sensor 13. Further, the control unit 10 detects a state of the chargeable battery 14 and controls a generated voltage of an alternator 15, thereby controlling a charge state of the chargeable battery 14. Note that the voltage sensor 11, the current sensor 12, and the temperature sensor 13 may be incorporated into the control unit 10, or may be provided outside the control unit 10.

The voltage sensor 11 detects a terminal voltage of the chargeable battery 14, and supplies the detected terminal voltage as a voltage detection signal to a CPU 10a via an I/F 10e. The current sensor 12 detects a current flowing in the chargeable battery 14, and supplies the detected current as a current detection signal to the CPU 10a via the I/F 10e.

For example, the temperature sensor 13 is a thermistor, a thermocouple, or the like, and is disposed at a position close to an electrolytic cell of the chargeable battery 14. The temperature sensor 13 detects an external temperature of the chargeable battery 14, and supplies the detected external temperature as a temperature detection signal to the CPU 10a via the I/F 10e.

Note that, in the present embodiment, wording "internal temperature" refers to a temperature of an electrolytic solution of the chargeable battery 14. Further, wording "external temperature" refers to a temperature outside the chargeable battery 14, and refers to, for example, an ambient temperature of an environment, in which the chargeable battery 14 is disposed, or a temperature of resin constituting the electrolytic cell.

As a matter of course, a temperature of an electrode terminal itself (not illustrated) of the chargeable battery 14, an ambient temperature thereof, or a temperature inside a vent plug (not illustrated) may be used as the external temperature. Note that it is desirable that the position to provide the temperature sensor 13 be near a part of the electrolytic cell where the electrolytic solution is filled, for example, because the electrolytic solution is the target of internal temperature estimation. Further, since the internal temperature is affected by heat from an engine 16 as will be described later, a position at which the temperature sensor 13 is attached may be a position as close as possible to an engine 16.

Note that, rather than causing the control unit 10 to control the charge state of the chargeable battery 14 by controlling the generated voltage of the alternator 15, for example, an ECU (not illustrated) may control the charge state.

The chargeable battery 14 is a chargeable battery including an electrolytic solution, such as a lead-acid battery, a nickel-cadmium battery, or a nickel-metal hydride battery, and is charged by the alternator 15, and drives a starter motor 17 to start an engine, and moreover supplies electric power to a load 18. Note that the chargeable battery 14 is constituted of a plurality of cells connected in series. The alternator 15 is driven by the engine 16, generates AC power and converts the generated AC power into DC power through a rectifier circuit, and charges the chargeable battery 14. The alternator 15 is controlled by the control unit 10, and can adjust the generated voltage.

For example, the engine 16 is a reciprocating engine, such as a petrol engine or a diesel engine, or a rotary engine, etc., is started by the starter motor 17, and drives drive wheels via a transmission to supply propulsive power to the vehicle. The engine 16 also drives the alternator 15 to generate electric power. For example, the starter motor 17 is a DC motor, and generates a rotational force by using electric power supplied from the chargeable battery 14 to start the engine 16. For example, the load 18 is formed by an electric power steering motor, a defogger, a seat heater, an ignition coil, a car audio system, a car navigation system, or the like. The load 18 runs on electric power supplied from the chargeable battery 14.

Figure 2:
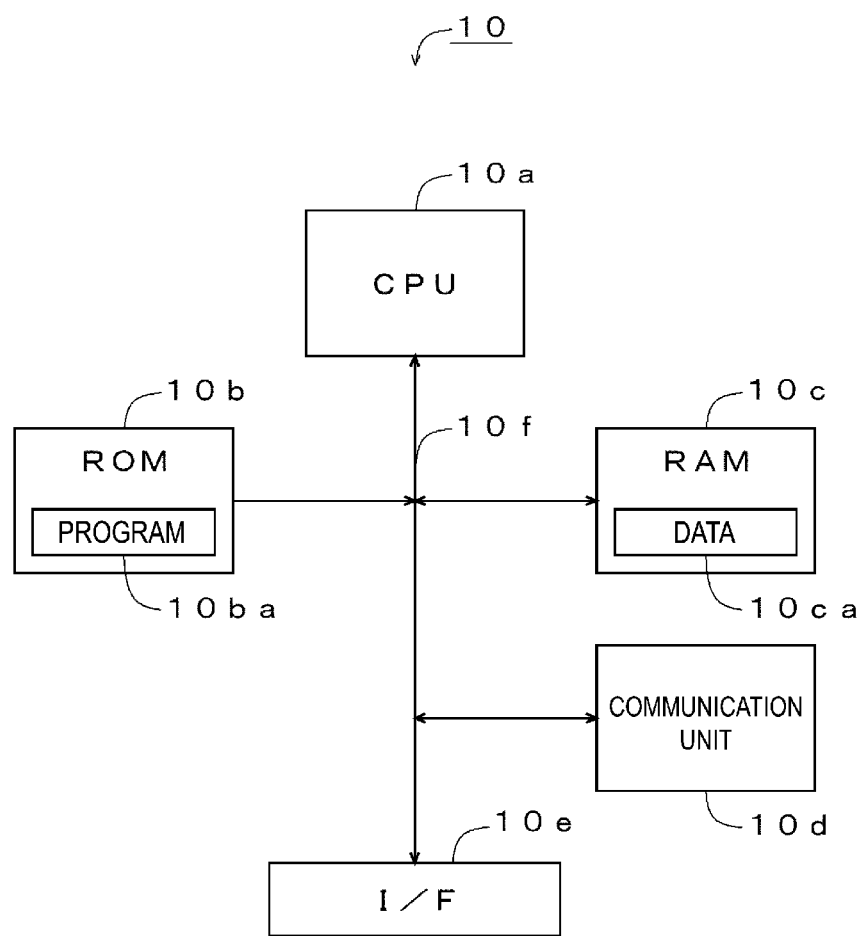
FIG. 2 is a block diagram illustrating a detailed configuration example of a control unit of FIG. 1.

FIG. 2 is a diagram illustrating a detailed configuration example of the control unit 10 illustrated in FIG. 1. As illustrated in FIG. 2, the control unit 10 includes a central processing unit (CPU) 10a, a read-only memory (ROM) 10b, a random access memory (RAM) 10c, a communication unit 10d, an interface (I/F) 10e, and a bus 10f. Here, the CPU 10a controls components, based on a program 10ba stored in the ROM 10b. The ROM 10b is a semiconductor memory or the like, and stores, for example, the program 10ba that can be executed by the CPU 10a. The RAM 10c is a semiconductor memory or the like, and stores data, generated at a time of execution of the program 10*ba*, and data 10*ca* (described later) such as a table. The communication unit 10*d* performs communication with an ECU serving as a higher-level device, for example, and reports detected information or control information to the higher-level device. The I/F 10*e* imports signals supplied from the voltage sensor 11, the current sensor 12, and the temperature sensor 13 by converting the signals into digital signals, and supplies a driving current to the alternator 15 and the starter motor 17, for example, to control the same. The bus 10*f* is a group of signal lines for connecting the CPU 10*a*, the ROM 10*b*, the RAM 10*c*, the communication unit 10*d*, and the I/F 10*e* to one another, and for enabling these to exchange information with one another. Note that a digital signal processor (DSP), a field programmable gate array (FPGA), or an application specified integrated circuit (ASIC) may be used in place of the CPU 10*a*.

Figure 3:
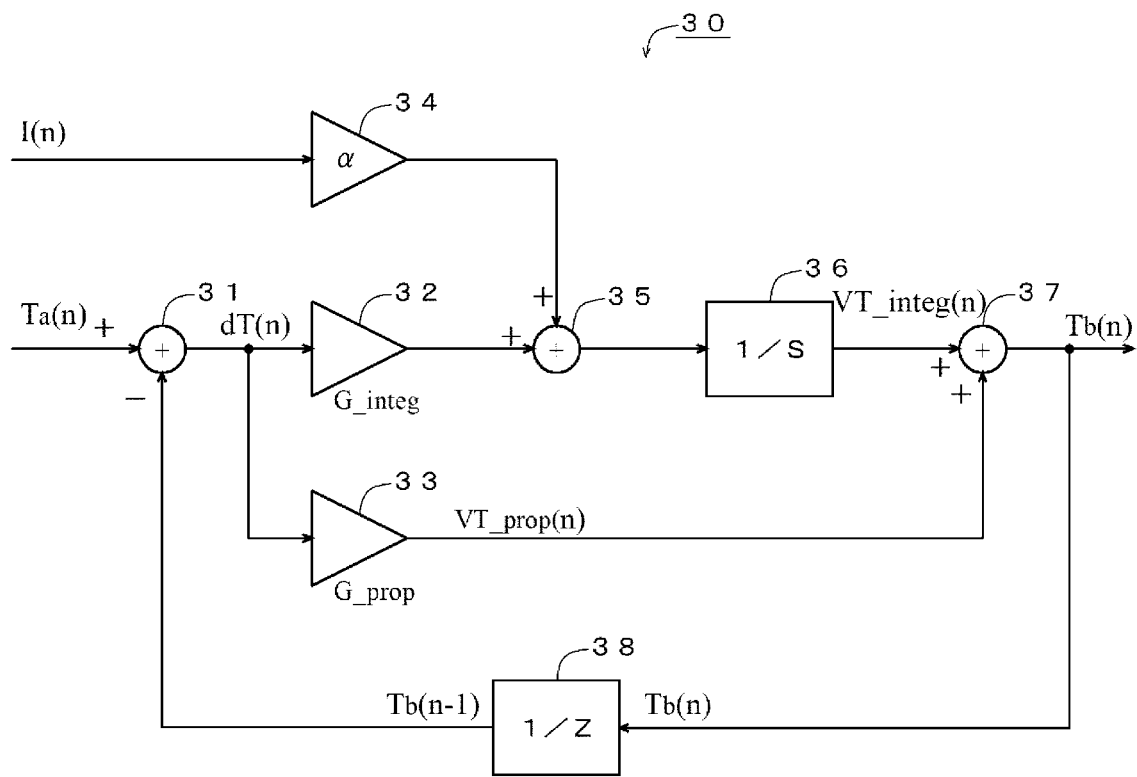
FIG. 3 is a block diagram illustrating an algorithm to be implemented when a program illustrated in FIG. 2 is executed.

FIG. 3 is a block diagram illustrating a temperature estimation algorithm implemented when the program 10*ba* illustrated in FIG. 2 is executed. The block diagram illustrated in FIG. 3 includes an adder-subtractor circuit 31, constant multiplier circuits 32 to 34, adder circuits 35 and 37, an integrator circuit 36, and a delay circuit 38.

Here, the adder-subtractor circuit 31 subtracts a previous estimated temperature value Tb(n−1), which is output from the delay circuit 38, from a detected temperature value Ta(n), which is supplied from the temperature sensor 13, and outputs an obtained value as a difference value dT(n). Note that n represents the number of times of processing.

The constant multiplier circuit 32 outputs a value obtained by multiplying the difference value dT(n), which is output from the adder-subtractor circuit 31, by G_integ, i.g., an integral gain. The constant multiplier circuit 33 outputs a value obtained by multiplying the difference value dT(n), which is output from the adder-subtractor circuit 31, by G_prop, i.e., a proportional gain.

The constant multiplier circuit 34 inputs a detected current value I detected using the current sensor 12, and outputs a value obtained by multiplying the input detected current value I by α, i.e., a coefficient. The adder circuit 35 adds together the value output from the constant multiplier circuit 32 and the value output from the constant multiplier circuit 34, and outputs the same.

The integrator circuit 36 integrates the value output from the adder circuit 35, and outputs the same. The adder circuit 37 adds the output value of the constant multiplier circuit 33 and the output value of the integrator circuit 36, and outputs an obtained value as an estimated temperature value Tb(n).

The delay circuit 38 delays the estimated temperature value Tb(n), which is output from the adder circuit 37, by one sample period, and outputs the same as Tb(n−1) to the adder-subtractor circuit 31.

Note that the above block diagram is represented by following expressions (1) to (3).

$$Tb(n)=VT\_prop(n)+VT\_integ(n) \quad (1)$$

Here, $$VT\_prop(n)=dT(n) \times G\_prop \quad (2)$$

and $$VT\_integ(n)=dT(n) \times G\_integ+VT\_integ(n-1)+I(n) \times \alpha \quad (3)$$

(B) Description of Operation According to Embodiment of Disclosure

Next, an outline of operation according to the present embodiment will be described. In the present embodiment, when the program 10*ba* illustrated in FIG. 2 is executed, the algorithm of the block diagram illustrated in FIG. 3 is implemented, a detected temperature value output from the temperature sensor 13 is sampled in a predetermined period, and an estimated temperature value is output based on a proportional operation and an integral operation. Then, the estimated temperature value obtained as described above is supplied to an ECU (not illustrated). The ECU executes processing such as temperature correction of a state of charge (SOC), based on the supplied estimated temperature value, for example.

When the algorithm of the block diagram illustrated in FIG. 3 is implemented by executing the program 10*ba* illustrated in FIG. 2, following operation is executed.

Specifically, the adder-subtractor circuit 31 inputs a detected temperature value Ta(n) supplied from the temperature sensor 13, subtracts Tb(n−1), which is an estimated temperature value of the immediately preceding sampling period supplied from the delay circuit 38, from the supplied detected temperature value Ta(n), and outputs the difference as dT(n).

The constant multiplier circuit 32 multiplies dT(n), which is output from the adder-subtractor circuit 31, by G_integ, i.e., an integral gain, and outputs the same. The constant multiplier circuit 33 multiplies dT(n), which is output from the adder-subtractor circuit 31, by G_prop, i.e., a proportional gain, and outputs the same.

The constant multiplier circuit 34 multiplies a detected current value I(n), which is supplied from the current sensor 12, by a, and outputs the result. This output represents a heating value—the amount of heat generated in the battery 14.

Here, α is a constant, the value of which varies according to a value of a current flowing in the chargeable battery 14 and a direction of the current. More specifically, the value of the coefficient α of the constant multiplier circuit 34 can be represented as follows. As described below, a is a heating coefficient function and is a multiplication factor to be multiplied with I to yield the heating value—the amount of heat generated in the battery 14.

When the chargeable battery 14 is being charged, $$\alpha=fc(I) \quad (4)$$

When the chargeable battery 14 is being discharged, $$\alpha=fd(I) \quad (5)$$

Here, fc(I) is a function, the independent variable of which is a current I, and is a function, the value of which varies according to a charging current I. Further, fd(I) is a function, the independent variable of which is a current I, and is a function, the value of which varies according to a discharging current I.

fc(I) and fd(I) can be calculated through actual measurement. The dependence of fc(I) and fd(I) on a current varies according to presence or absence of an insulator provided to protect the chargeable battery 14 from temperature variation, the size of the chargeable battery 14, the number of electrode plates thereof, a type thereof (a general liquid type or a sealed type), or the like. For this reason, by individually calculating fc(I) and fd(I) according to presence or absence of an insulator, the size, the number of electrode plates, the type (a general liquid type or a sealed type), or the like, the internal temperature of the chargeable battery 14 can be estimated with even higher accuracy.

Further, to take an example of a lead-acid battery mounted on a vehicle, a discharge reaction of a lead-acid battery is an endothermic reaction, and a charge reaction thereof is an exothermic reaction. For this reason, by using the functions fc(I) and fd(I) suitable respectively for individual cases of charge and discharge, the internal temperature can be calculated with high accuracy.

Note that fc(I) and fd(I) also vary according to a deterioration state of the chargeable battery 14. For example, when deterioration of a lead-acid battery progresses, the internal resistance increases, and thus Joule heat ($I^2 \times R$) increases. For this reason, by correcting fc(I) and fd(I) in accordance with a deterioration state of the chargeable battery 14, the internal temperature can be accurately estimated, regardless of the deterioration state.

The adder circuit 35 adds together the output value of the constant multiplier circuit 34 and the output value of the constant multiplier circuit 32, and supplies the same to the integrator circuit 36. The integrator circuit 36 integrates the output value of the adder circuit 35, and supplies the same to the adder circuit 37. The adder circuit 37 adds together the output value of the integrator circuit 36 and the output value of the constant multiplier circuit 33, and outputs the same as an estimated temperature value Tb(n) relating to the internal temperature of the chargeable battery 14.

The delay circuit 38 delays the output value of the adder circuit 37 by one sampling period, and supplies the same to the adder-subtractor circuit 31.

Through the operation described above, the internal temperature of the chargeable battery 14 can be estimated, based on a detected current value acquired by the current sensor 12 and a detected temperature value acquired by the temperature sensor 13.

Figure 4:
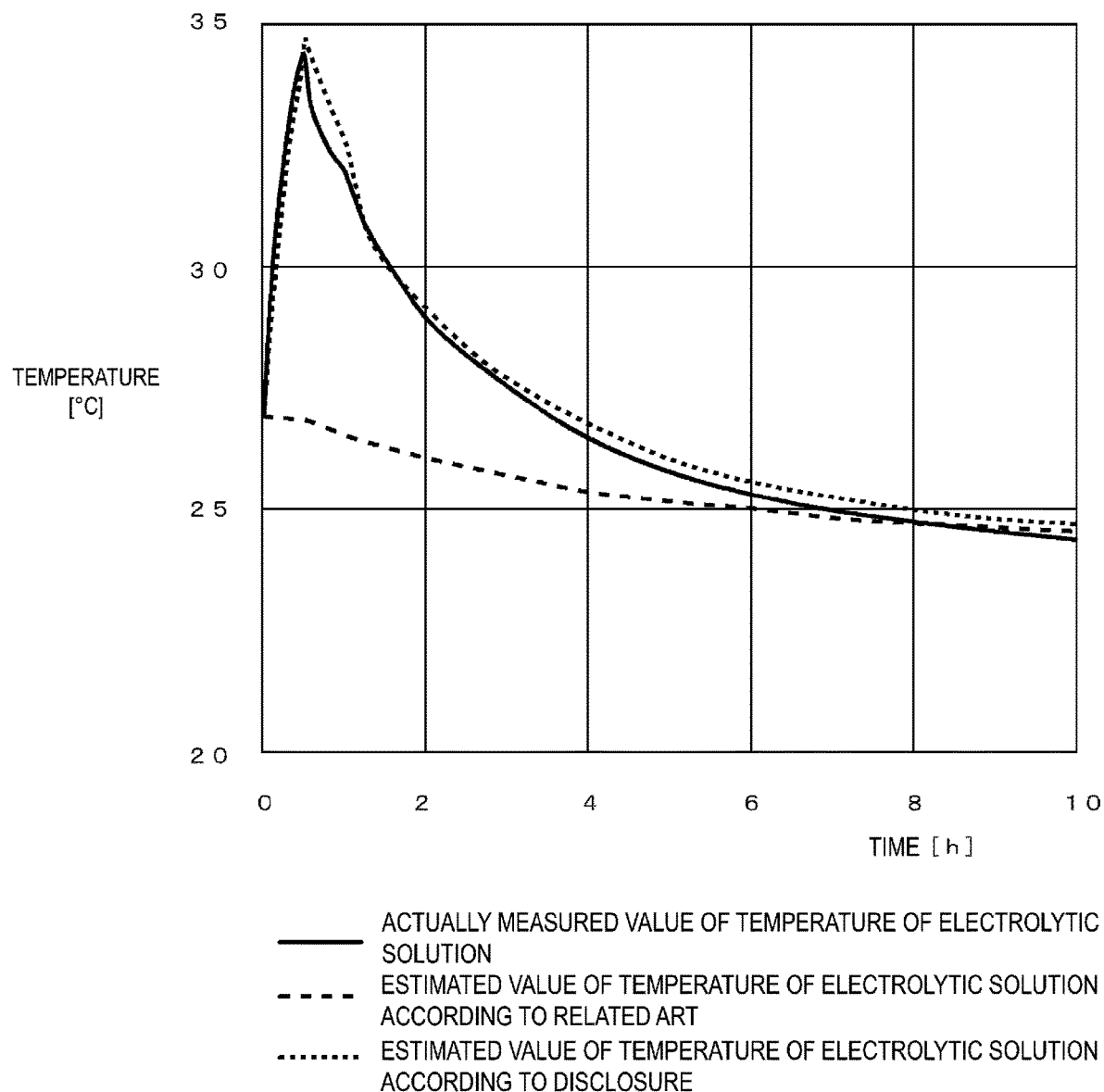
FIG. 4 is a graph showing a result of comparison between actually measured results and estimated results according to the present embodiment, and moreover estimated results according to technology of Patent Document 1.

FIG. 4 is a graph showing a comparison between estimated results of internal temperature according to the present embodiment and estimated results of internal temperature according to technology disclosed in Patent Document 1. The vertical axis of FIG. 4 represents temperature [° C.], and the horizontal axis represents time [h]. Further, the solid line indicates actually measured results, the densely dashed line indicates estimated results of internal temperature according to the present embodiment, and the loosely dashed line indicates estimated results of internal temperature according to technology disclosed in Patent Document 1. Note that the actual measurement is performed in the following procedure: The chargeable battery 14 is repeatedly charged and discharged with charging and discharging currents of 50 A alternately at intervals of 30 seconds for 30 minutes. Then, the chargeable battery 14 is repeatedly charged and discharged with charging and discharging currents of 20 A alternately at intervals of 30 seconds for 30 minutes. Subsequently, the charge and discharge are stopped, whereby temperature variation is actually measured.

Comparison between the solid line and the loosely dashed line according to Patent Document 1 in FIG. 4 shows that there is a great gap between the two lines. In contrast, comparison between the solid line and the densely dashed line shows that the two lines are very close to each other. As shown in FIG. 4, in the present embodiment, with heat generation and heat absorption occurring due to charge and discharge being taken into consideration, estimation accuracy of the present embodiment is enhanced more than that of technology disclosed in Patent Document 1.

As described above, in the embodiment of the disclosure, the constant multiplier circuit 34 and the adder circuit 35 illustrated in FIG. 3 are provided such that a value according to a detected current value detected by the current sensor 12 is added, therefore, as shown in FIG. 4, internal temperature can be accurately estimated even when charge and discharge are being performed.

Figure 5:
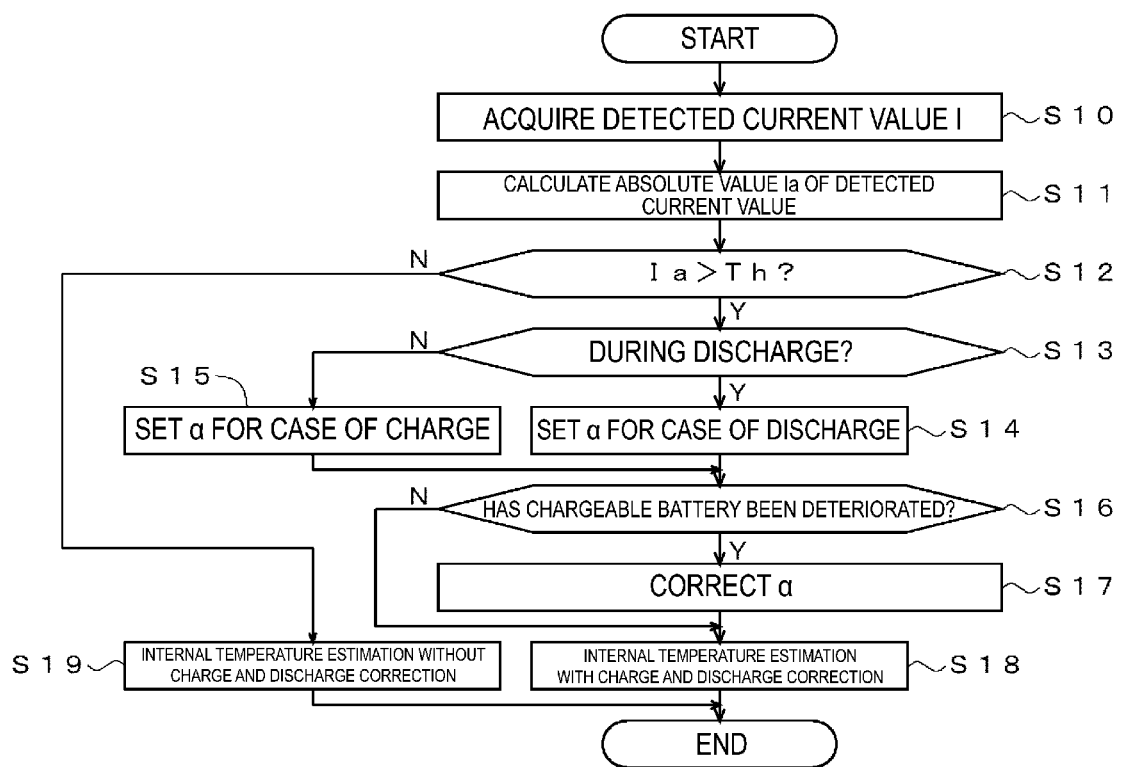
FIG. 5 is a flowchart for describing a flow of processing executed in the embodiment illustrated in FIG. 1.

Next, with reference to FIG. 5, details of processing executed by the control unit 10 illustrated in FIG. 1 will be described. When processing of the flowchart illustrated in FIG. 5 is started, following steps are executed.

In Step S10, the CPU 10*a* acquires a detected current value I detected by the current sensor 12, via the I/F 10*e*. Note that the detected current value may be defined as being positive when the chargeable battery 14 is being charged, and the detected current value may be defined as being negative when the chargeable battery 14 is being discharged. As a matter of course, the reverse definition may be used.

In Step S11, the CPU 10*a* calculates an absolute value Ia of the detected current value I acquired in Step S10. For example, when the current acquired in Step S10 is −25 A, 25 A is obtained.

In Step S12, the CPU 10*a* compares the absolute value Ia of the detected current value calculated in Step S11 and a predetermined threshold value Th. When the CPU 10*a* determines that Ia>Th (Step S12: Y), the process proceeds to Step S13. Otherwise (Step S12: N), the process proceeds to Step S19. For example, when Ia>Th (1 A), the process proceeds to Step S13.

Figure 9:
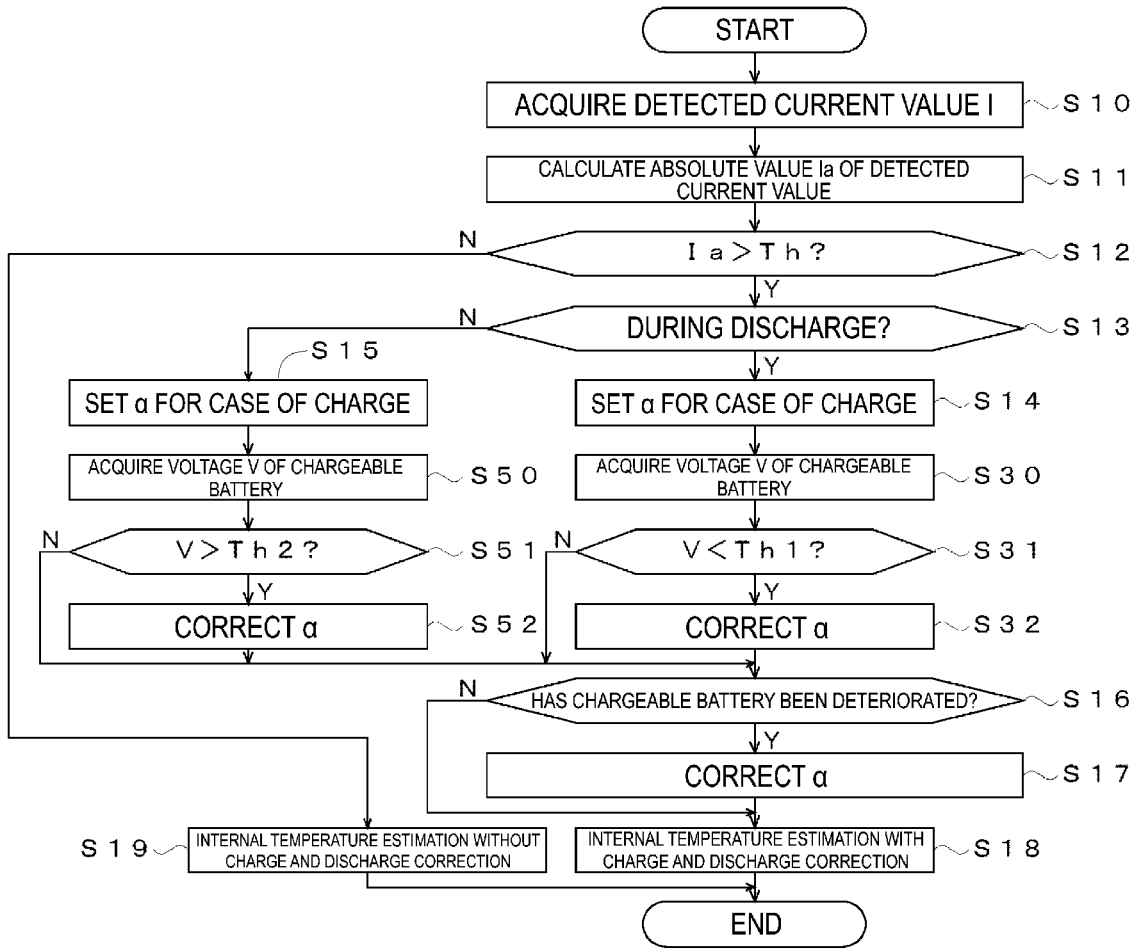
FIG. 9 is a diagram illustrating errors in a charge and discharge pattern shown in FIG. 11.

In Step S13, the CPU 10*a* determines whether or not the chargeable battery 14 is being discharged. When the CPU 10*a* determines that the chargeable battery 14 is being discharged (Step S13: Y), the process proceeds to Step S14. Otherwise (Step S13: N), the process proceeds to Step S15. For example, when the detected current value acquired in FIG. 9 is negative, the CPU 10*a* can determine that the chargeable battery 14 is being discharged.

In Step S14, the CPU 10*a* sets a shown in expression (5) for the constant multiplier circuit 34.

In Step S15, the CPU 10*a* sets a shown in expression (4) for the constant multiplier circuit 34.

In Step S16, whether or not the chargeable battery 14 is deteriorated is determined. When determination is made that the chargeable battery 14 is deteriorated (Step S16: Y), the process proceeds to Step S17. Otherwise (Step S16: N), the process proceeds to Step S18. For example, a voltage and a current used when the engine 16 is started are measured by the voltage sensor 11 and the current sensor 12, respectively. Using the measured results, a state of health (SOH), which indicates deterioration of the chargeable battery 14, is calculated. When the SOH is less than a predetermined threshold value, determination is made that the chargeable battery 14 is deteriorated, and the process proceeds to Step S17.

In Step S17, the CPU 10*a* corrects the value of a in accordance with the deterioration state of the chargeable battery 14. More specifically, when the chargeable battery 14 is significantly deteriorated, the internal resistance increases and thus the amount of generated Joule heat increases. For this reason, a for the case of charge and a for the case of discharge described above are corrected in accordance with a degree of deterioration.

In Step S18, the CPU 10*a* executes temperature estimation processing that includes charge and discharge correction. More specifically, the CPU 10*a* executes processing of estimating the internal temperature of the chargeable battery 14 in consideration of the output from the constant multiplier circuit 34 in FIG. 3.

In Step S19, the CPU 10*a* executes internal temperature estimation processing that does not include charge and discharge correction. More specifically, the CPU 10*a* executes processing of estimating the internal temperature of the chargeable battery 14 without consideration of the output from the constant multiplier circuit 34 in FIG. 3 (with the constant multiplier circuit 34 being stopped).

According to the processing described above, the internal temperature is estimated in consideration of Joule heat and chemical reaction heat generated due to charge and discharge of the chargeable battery 14. Therefore, the internal temperature can be accurately estimated.

Further, when the charging and discharging currents are larger than the predetermined threshold value Th, internal temperature estimation processing that includes charge and discharge correction is executed. Otherwise, the internal temperature estimation processing that does not include charge and discharge correction is executed. Thus, cost of calculation can be reduced by stopping the operation of the constant multiplier circuit 34 when the charging and discharging currents under smaller influence are less than the threshold value.

Further, α is corrected in consideration of deterioration of the chargeable battery 14. Therefore, the internal temperature can be accurately estimated regardless of the state of deterioration of the chargeable battery 14.

(C) Description of Modified Embodiments

It goes without saying that the above embodiment is merely an example, and the disclosure is not limited only to the cases as described above. For example, in the above embodiment, charge and discharge correction is performed by using expression (4) and expression (5) described above. However, for example, a table showing correspondence between the detected current value and the value of a may be stored in the RAM 10c, for example, and charge and discharge correction may be performed with reference to the table.

Further, in the flowchart illustrated in FIG. 5, the same threshold value Th is used for both charge and discharge. However, for example, different threshold values may be used for charge and discharge respectively. For example, in the case of charge, determination may be made using a threshold value Th1, and in the case of discharge, determination may be made using a threshold value Th2 (Th1≠Th2). For example, when even a small detected current value has larger influence during discharge, the threshold values may be set to satisfy Th2<Th1.

Further, in the example of FIG. 5, a is corrected when the chargeable battery 14 is deteriorated to a predetermined degree or more. However, following expression (6) and expression (7) may be used, which are the same as expression (4) and expression (5), respectively, except the SOH is taken into consideration. Note that a table may be used instead of a mathematical expression.

When the chargeable battery 14 is being charged, $$\alpha = fc(I, SOH) \quad (6)$$

When the chargeable battery 14 is being discharged, $$\alpha = fd(I, SOH) \quad (7)$$

Further, the proportional gain and the integral gain of the constant multiplier circuits 32 and 33 illustrated in FIG. 3 may be set according to an operation state of a vehicle. For example, each of the proportional gain and the integral gain of the constant multiplier circuits 32 and 33 is divided into two types of gains as illustrated in FIG. 6. The two types of gains are, specifically, a first proportional gain and a first integral gain each having a larger value, and a second proportional gain and a second integral gain each having a smaller value. The two types of gains are set according to an operation state of the vehicle.

More specifically, when the engine 16 is in an operation state, the first proportional gain and the first integral gain are set for the constant multiplier circuits 32 and 33, whereas when the engine 16 is in a stopped state, the second proportional gain and the second integral gain are set for the constant multiplier circuits 32 and 33. The gains are changed according to a state of the vehicle as described above because a tendency of temperature variation of the chargeable battery 14 varies according to an operation state of the vehicle, in particular, an operation state of the engine 16.

Specifically, the temperature variation of the chargeable battery 14 is mainly caused by heat generated due to operation of the engine 16 and transferred to the chargeable battery 14 through thermal radiation, or transferred to the chargeable battery 14 by air generated due to traveling of the vehicle or air generated by a radiator fan, for example.

Specifically, the engine 16 is disposed in an engine compartment, where the chargeable battery 14 is disposed. The engine 16 generates a large amount of heat continuously during operation of the engine 16, and thus the temperature rises sharply. When the engine 16 is stopped, by contrast, the heat of the engine 16 itself and the heat remaining in the engine compartment are cooled through natural cooling, and thus the temperature gently falls. This means that the rate of temperature variation differs between a case when temperature rises and a case when temperature falls. For this reason, in the present embodiment, temperature is estimated separately for these cases.

Incidentally, the voltage of the chargeable battery 14 lowers when the SOC of the chargeable battery 14 is low, or when the chargeable battery 14 is significantly deteriorated, or moreover when the temperature thereof is low. When the chargeable battery 14 is charged or discharged in such cases, the internal resistance may increase more than usual.

The internal resistance includes conductor resistance, liquid resistance, anode reaction resistance, cathode reaction resistance, and diffusion resistance.

Among these resistances, the cathode reaction resistance and the diffusion resistance may cause large errors when the chargeable battery 14 is discharged while the voltage thereof is low, as caused by increased values of these two resistances. In view of this, in the flowchart according to another embodiment illustrated in FIG. 7, α is corrected when the voltage of the chargeable battery 14 is less than a predetermined threshold value while the chargeable battery 14 is discharged.

Figure 7:
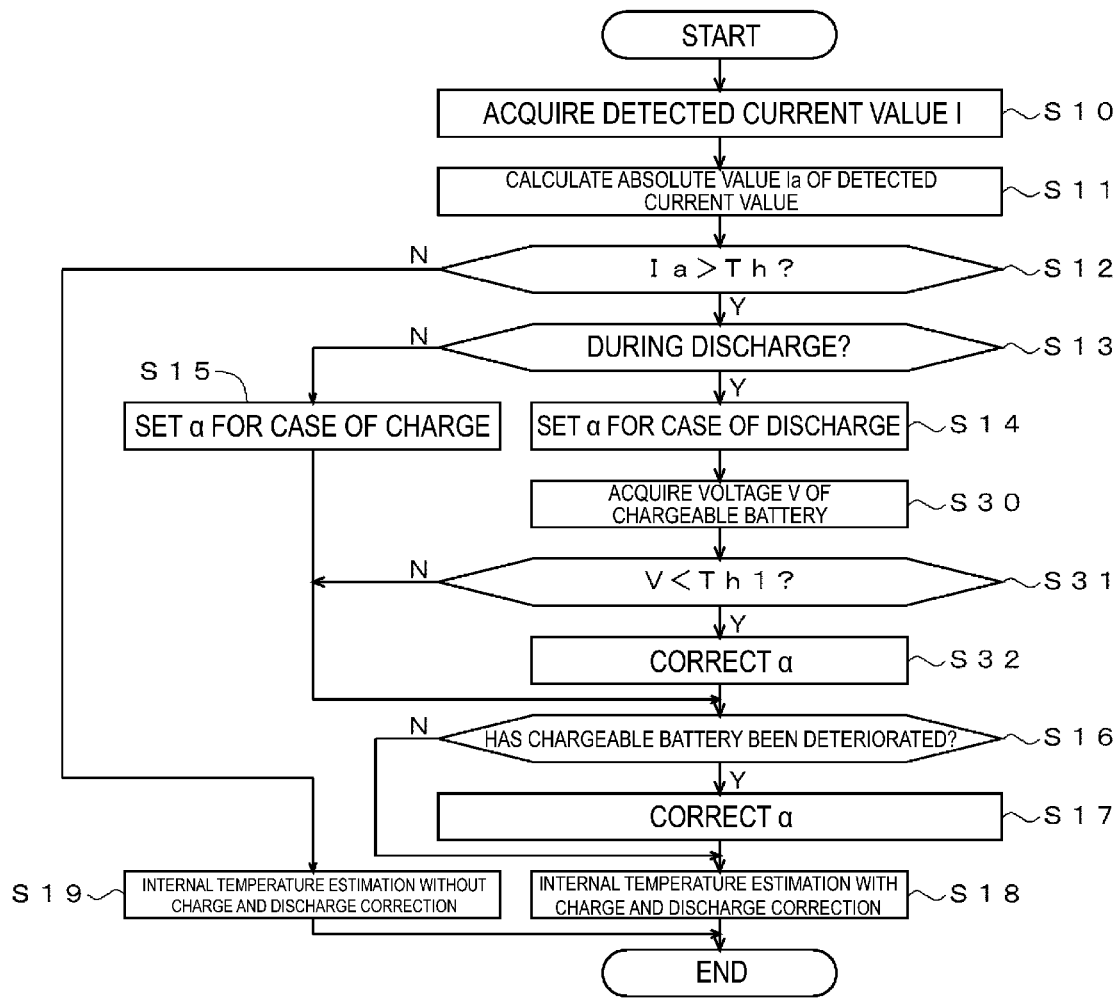
FIG. 7 is a flowchart for describing operation according to another embodiment of the disclosure.

Note that, in FIG. 7, parts corresponding to FIG. 5 are denoted by the same reference signs, and description thereof is omitted. In FIG. 7, Step S30 to Step S32 are added, which differ from FIG. 5. Other steps are same as those of FIG. 5, and thus Step S30 to Step S32 will be described below.

In Step S30, the CPU 10a acquires a voltage of the chargeable battery 14. More specifically, the CPU 10a acquires a terminal voltage of the chargeable battery 14 from the voltage sensor 11, via the I/F 10e.

In Step S31, the CPU 10a compares a voltage V acquired in Step S30 and a threshold value Th1. When V<Th1 is satisfied (Step S31: Y), the process proceeds to Step S32. Otherwise (Step S31: N), the process proceeds to Step S16. For example, if the voltage V is less than the threshold value Th1 (for example, 10 V), it is determined that the process follows Y, and the process proceeds to Step S32.

In Step S32, the CPU 10a corrects a. More specifically, for example, a is corrected based on following expression (8). Here, fdl(I, V, SOH) is a function, the independent variables of which are current I, V, and SOH, and is a function, the value of which varies according to a discharging current I, a voltage V, and a state of health (SOH). Note that, in comparison with expression (7), fdl(I, V, SOH)>fd(I, SOH) is satisfied.

$$\alpha = fdl(I, V, SOH) \quad (8)$$

As described above, according to the processing of the flowchart illustrated in FIG. 7, α is corrected according to expression (8) when the terminal voltage V is less than the predetermined threshold value Th1 while the chargeable battery 14 is being discharged. This correction allows α to cover the increase of the cathode reaction resistance and the diffusion resistance. Thus, errors in estimation of temperature can be reduced.

Note that, in the above, description is made on correction of a when the chargeable battery 14 is discharged while the voltage of the chargeable battery 14 is low, however, by correcting α when the chargeable battery 14 is charged also while the voltage of the chargeable battery 14 is high, errors in estimation of temperature can be reduced.

Specifically, when the voltage of the chargeable battery 14 is high, water is electrolyzed, and gases (hydrogen and oxygen) adhere on a surface of the electrode plates, with the gases hindering contact between the electrolytic solution and the surface of the electrode plates. This may increase the internal resistance.

Figure 8:
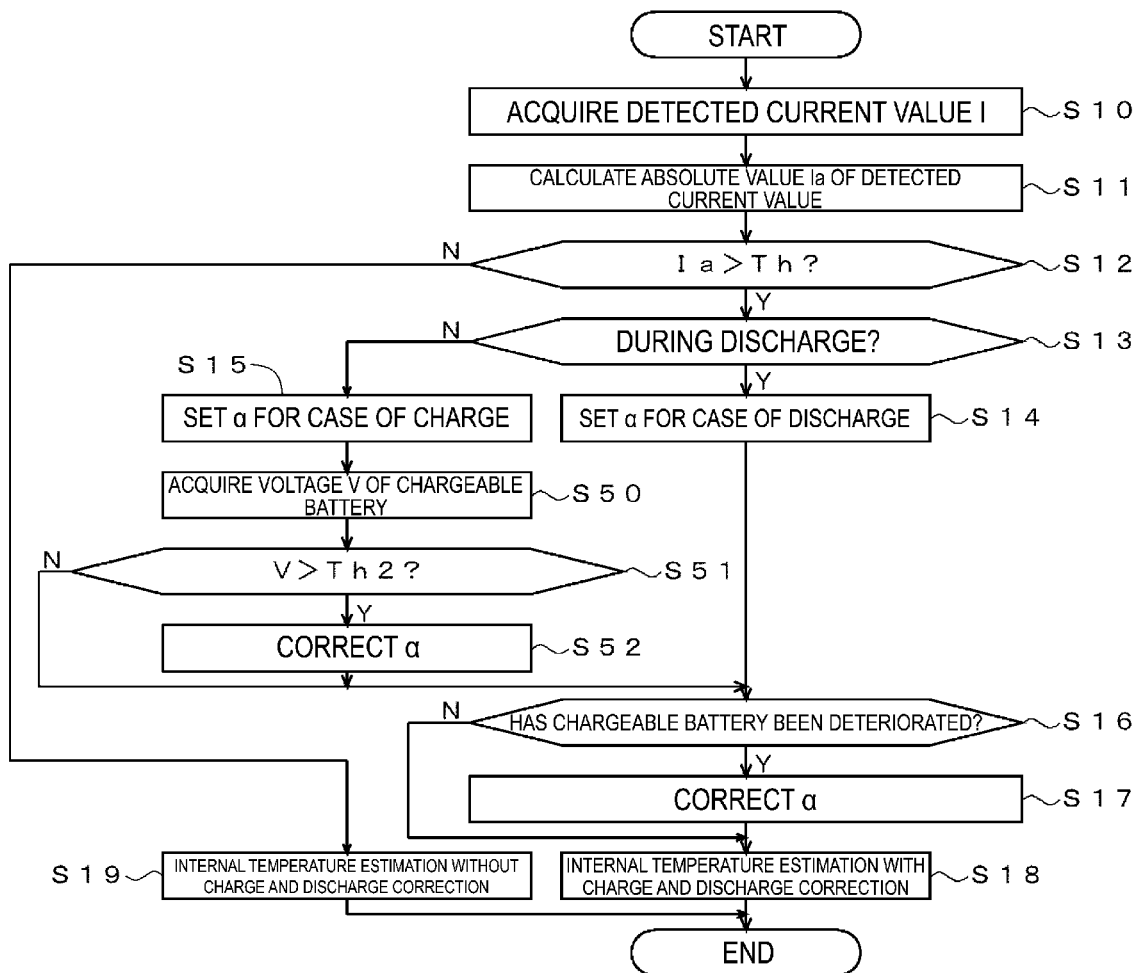
FIG. 8 is a flowchart for describing operation according to another embodiment of the disclosure.

In view of this, in the flowchart according to another embodiment illustrated in FIG. 8, α is corrected when the voltage of the chargeable battery 14 is larger than a predetermined threshold value Th2 while the chargeable battery 14 is being charged.

Note that, in FIG. 8, parts corresponding to FIG. 5 are denoted by the same reference signs, and description thereof is omitted. In FIG. 8, Step S50 to Step S52 are added, which differ from FIG. 5. Other steps are similar to those of FIG. 5, and thus Step S50 to Step S52 will be described below.

In Step S50, the CPU 10a acquires a terminal voltage V of the chargeable battery 14. More specifically, the CPU 10a acquires a terminal voltage of the chargeable battery 14 from the voltage sensor 11, via the I/F 10e.

In Step S51, the CPU 10a compares the voltage V acquired in Step S50 and a threshold value Th2. When V>Th2 is satisfied (Step S51: Y), the process proceeds to Step S52. Otherwise (Step S51: N), the process proceeds to Step S16. For example, when the voltage V exceeds the threshold value Th2 (for example, 15 V), determination is made to be Y, and the process proceeds to Step S52.

In Step S52, the CPU 10a corrects a. More specifically, for example, a is corrected, based on following expression (9). Here, fci(I, V, SOH) is a function, the independent variables of which are current I, V, and SOH, and is a function, the value of which varies according to a discharging current I, a voltage V, and an SOH. Note that, in comparison with expression (6), fci(I, V, SOH)>fc(I, SOH) is satisfied.

$$\alpha = fci(I, V, SOH) \quad (9)$$

As described above, according to the processing of the flowchart illustrated in FIG. 8, a is corrected according to a value obtained by expression (9) when the terminal voltage V exceeds the predetermined threshold value Th2 while the chargeable battery 14 is being charged. This correction allows α to cover the increase of the internal resistance due to the gasses generated in electrolysis. Thus, errors in estimation of temperature can be reduced.

Note that, in the embodiments illustrated in FIG. 7 and FIG. 8, correction of α is separately executed for charge and for discharge. However, as illustrated in FIG. 9, correction of a illustrated in FIG. 7 and FIG. 8 may be executed in the same flowchart. Specifically, the flowchart illustrated in FIG. 9 includes both the processing of Step S30 to Step S32 illustrated in FIG. 7 and the processing of Step S50 to Step S52 illustrated in FIG. 8. With this flowchart, α can be corrected according to expression (8) when V<Th1 during discharge, and a can be corrected according to expression (9) when V>Th2 during charge.

Figure 10:
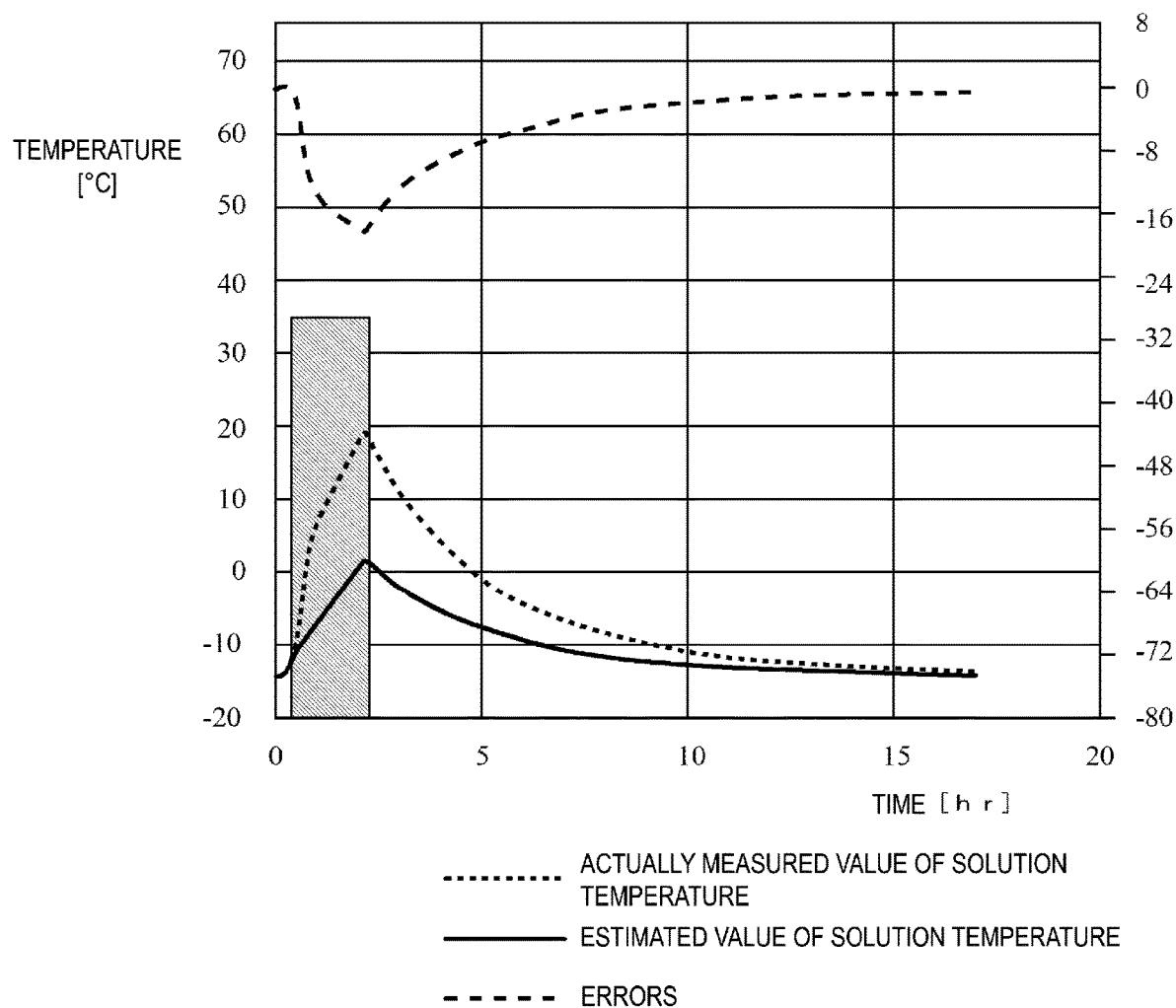
FIG. 10 is a graph showing errors in a charge and discharge pattern shown in FIG. 11.
Figure 11:
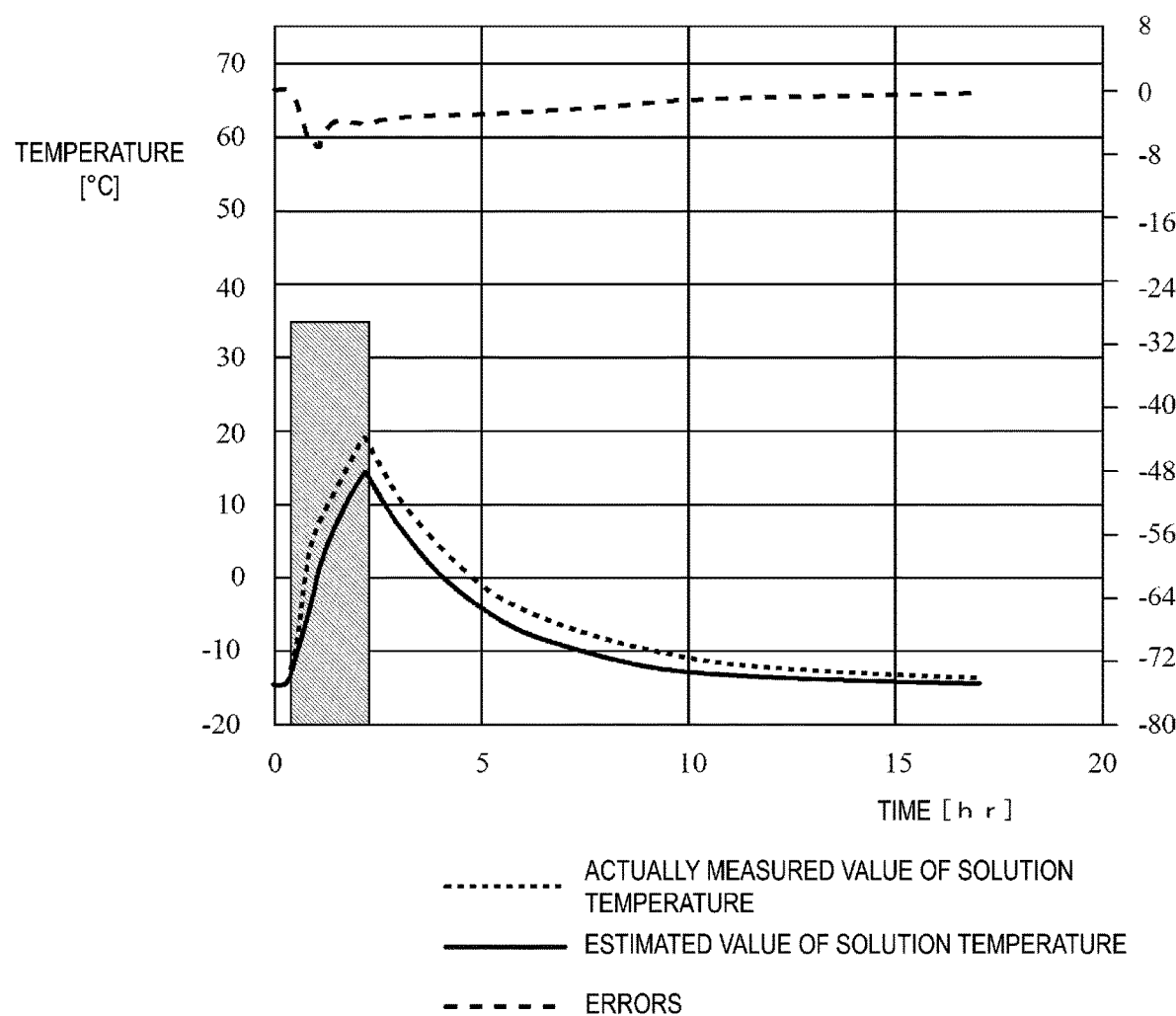
FIG. 11 is a graph showing an example of a charge and discharge pattern.

FIG. 10 and FIG. 11 are each a graph showing actually measured results. More specifically, FIG. 10 shows measured results obtained when the processing illustrated in FIG. 5 is executed, and FIG. 11 shows actually measured results obtained when the processing illustrated in FIG. 9 is executed.

Figure 12:
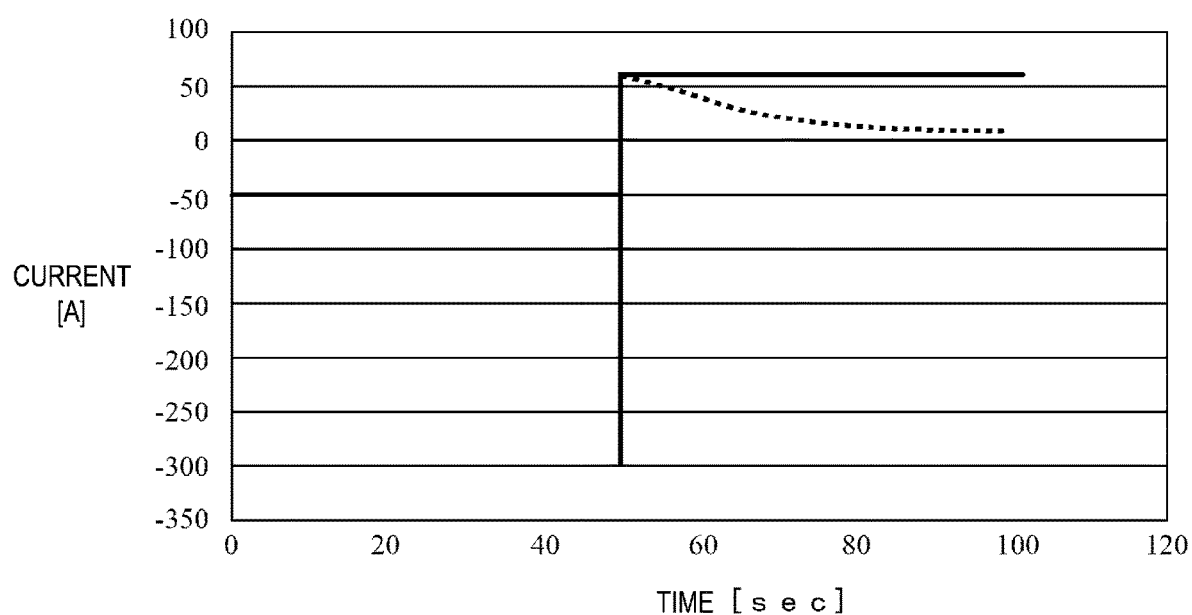
FIG. 12 is a flowchart for describing operation according to another embodiment of the disclosure.

In FIG. 10, charge and discharge as shown in FIG. 12 are repeatedly executed in a hatched rectangular area, and this FIG. 10 shows an estimated value and an actually measured value of a solution temperature. Specifically, in FIG. 12 one cycle of operation includes the following: Firstly, (1) discharge is executed with 48 A for 50 seconds. Next, (2) discharge is executed with 300 A for one second. Lastly, (3) charge is executed with 60 A for 50 seconds. The cycle of (1) to (3) is repeatedly executed. Note that the charge of (3) is constant voltage charge, and thus an actual current value varies as indicated by the dashed line.

As a result of execution of the processing of the flowchart illustrated in FIG. 5, as shown in FIG. 10, a gap between the estimated value, i.e., the actually measured value, and the actually measured value indicated by the densely dashed line is large. Further, errors as indicated by the loosely dashed line are large. In contrast, as a result of execution of the processing illustrated in FIG. 9, as shown in FIG. 11, a gap between the estimated value, i.e., the actually measured value, and the actually measured value indicated by the densely dashed line is small in comparison with FIG. 10. Further, errors as indicated by the loosely dashed line are small.

As described above, according to the processing illustrated in FIG. 9, in comparison with the processing of FIG. 5, occurrence of errors in estimation of temperature can be reduced by correcting the value of a in a case where the voltage is less than the threshold value Th1 during discharge or in a case where the voltage is larger than the threshold value Th2 during charge.

Note that the flowcharts illustrated in FIG. 5 and FIG. 7 to FIG. 9 are merely examples, and the present disclosure is not limited only to these flowcharts.

Further, in each of the above embodiments, the estimated temperature value is supplied to an ECU, and the ECU executes processing such as temperature correction on a state of charge, based on the estimated temperature value. Instead, the chargeable battery temperature estimation apparatus 1 may estimate a state of charge, based on the estimated temperature value. As a matter of course, the ECU may calculate, other than the SOC, index value (for example, a state of function (SOF) or an SOH) indicating a state of the chargeable battery 14, based on the estimated temperature value. Further, an operation state of the vehicle may be controlled, based on these calculated index values. For example, in a case of using the SOC, the chargeable battery 14 can be charged, with the ECU controlling the alternator 15. Further, in a case of using the SOH, since the SOH indicates a state of deterioration of the chargeable battery 14, a message that prompts replacement of the chargeable battery 14 may be presented when the SOH indicates that the value of deterioration the chargeable battery 14 is greater than or equal to a predetermined value. Further, in a case of using the SOF, for example, the SOF may be used to determine whether or not the engine 16 can be restarted after execution of so-called no idling, which is operation of stopping the engine 16 when the vehicle stops at a red light, for example, and, depending on results of the determination, the engine 16 may be stopped. As has been described above, according to the present disclosure, the temperature of the chargeable battery can be accurately estimated. Therefore, estimation accuracy of index values indicating a state of the chargeable battery, such as SOC, SOF, and SOH, can be enhanced. This makes it possible to achieve safe control and control leading to further improvement in fuel efficiency when a higher-level control device controls an operation state of the vehicle, based on the above-mentioned index values.

Note that expression (8) and expression (9) described above include SOH as a variable, however, these expressions may be expressions not including SOH, that is, expressions including variables of a voltage V and a current I.

The invention claimed is:

1. A chargeable battery temperature estimation apparatus estimating an internal temperature of a chargeable battery, the chargeable battery temperature estimation apparatus comprising:
    a processor; and
    a memory storing instructions executable by the processor,
    wherein the processor performs the following when executing the instructions stored in the memory:
        acquiring a detected current value output from a current sensor configured to detect a current flowing in the chargeable battery;
        calculating a heating value on the basis of the detected current value, the heating value estimating heat generated inside the chargeable battery;
        acquiring a detected external temperature value output from a temperature sensor configured to detect an external temperature of the chargeable battery;
        estimating the internal temperature of the chargeable battery based on the calculated heating value and the detected temperature value; and
        outputting the estimated internal temperature,
    wherein in calculating the heating value, the processor estimates, as the heating value, a sum of heat amounts of Joule heat and chemical reaction heat generated inside the chargeable battery by multiplying the detected current value by a coefficient α, and
    wherein in estimating the internal temperature, the processor performs the following:
        calculating a difference value between the detected temperature value and a previously estimated value of the internal temperature that has been previously estimated, and performs a proportional operation on the difference value,
        performing an integral operation on an added value of the heating value and the difference value, and
        adding together values obtained through the proportional operation and the integral operation.

2. The chargeable battery temperature estimation apparatus according to claim 1, wherein the coefficient α is a function of the detected current value, and a value of the coefficient α varies in accordance with the detected current value detected by the current sensor.

3. The chargeable battery temperature estimation apparatus according to claim 1, wherein the coefficient α is a function of the detected current value, and a value of the coefficient α varies depending on whether the chargeable battery is being charged or being discharged.

4. The chargeable battery temperature estimation apparatus according to claim 3, wherein the processor acquires a detected voltage value output from a voltage sensor configured to detect a voltage of the chargeable battery, and said function for the coefficient α is also a function of the detected voltage value of the chargeable battery when the chargeable battery is being charged.

5. The chargeable battery temperature estimation apparatus according to claim 3, wherein the processor acquires a detected voltage value output from a voltage sensor configured to detect a voltage of the chargeable battery, and said function for the coefficient α is also a function of the detected voltage value of the chargeable battery when the chargeable battery is being discharged.

6. The chargeable battery temperature estimation apparatus according to claim 1, wherein the processor sets a value of the coefficient α according to a state of deterioration of the chargeable battery.

7. The chargeable battery temperature estimation apparatus according to claim 1, wherein the processor calculates the heating value only when an absolute value of the detected current value detected by the current sensor is greater than or equal to a predetermined threshold value.

8. The chargeable battery temperature estimation apparatus according to claim 1, wherein the chargeable battery is configured to be mounted in a vehicle and the processor outputs the estimated internal temperature to the controller in the vehicle such that the controller in the vehicle changes an operation state of the vehicle based on the outputted estimated internal temperature.

9. A chargeable battery temperature estimation method for estimating an internal temperature of a chargeable battery, the chargeable battery temperature estimation method comprising:
    acquiring a detected current value output from a current sensor configured to detect a current flowing in the chargeable battery;
    calculating a heating value on the basis of the detected current value, the heating value estimating heat generated inside the chargeable battery;
    acquiring a detected temperature value output from a temperature sensor configured to detect an external temperature of the chargeable battery;
    estimating the internal temperature of the chargeable battery based on the heating value and the detected temperature value; and
    outputting the estimated internal temperature,
    wherein the calculating the heating value includes estimating, as the heating value, a sum of heat amounts of Joule heat and chemical reaction heat generated inside the chargeable battery by multiplying the detected current value by a coefficient α, and
    wherein the estimating the internal temperature includes:
        calculating a difference value between the detected temperature value and a previously estimated value of the internal temperature that has been previously estimated, and performs a proportional operation on the difference value,
        performing an integral operation on an added value of the heating value and the difference value, and adding together values obtained through the proportional operation and the integral operation.

\* \* \* \* \*